United States Patent [19]
Eisele et al.

[11] Patent Number: 5,516,404
[45] Date of Patent: May 14, 1996

[54] METHOD FOR MANUFACTURING A MICRO-ELECTRONIC COMPONENT HAVING AN ELECTRICALLY CONDUCTIVE TIP OF DOPED SILICON

[75] Inventors: Ignaz Eisele, Icking; Harald Gossner; Hermann Baumgaertner, both of Munich; Lothar Risch, Neubiberg, all of Germany

[73] Assignee: Siemens Aktiengesellschaft, Munich, Germany

[21] Appl. No.: 275,382

[22] Filed: Jul. 15, 1994

[30] Foreign Application Priority Data

Jul. 30, 1993 [DE] Germany .......................... 43 25 708.9

[51] Int. Cl.⁶ ...................................................... H01J 9/02
[52] U.S. Cl. ..................... 156/653.1; 156/657.1; 156/661.11; 437/228
[58] Field of Search ............ 437/89, 228; 427/595, 427/77; 156/657.1, 653.1, 661.11; 445/24, 49, 50

[56] References Cited

U.S. PATENT DOCUMENTS

| | | | |
|---|---|---|---|
| 3,746,908 | 7/1973 | Engeler | 315/10 |
| 5,013,682 | 5/1991 | Plumton et al. | 437/89 |
| 5,017,266 | 5/1991 | Zdeblick et al. | 156/643 |
| 5,090,932 | 2/1992 | Dieumegard et al. | 445/24 |
| 5,094,975 | 3/1992 | Siu | 437/89 |
| 5,127,990 | 7/1992 | Pribat et al. | 156/644 |
| 5,188,977 | 2/1993 | Stengl et al. | 437/89 |
| 5,313,484 | 5/1994 | Arimoto | 372/46 |
| 5,371,431 | 12/1994 | Jones et al. | 313/309 |

FOREIGN PATENT DOCUMENTS

| | | |
|---|---|---|
| 4041276 | 2/1992 | Germany . |
| 8909479 | 10/1989 | WIPO . |

Primary Examiner—Thi Dang
Attorney, Agent, or Firm—Hill, Steadman & Simpson

[57] ABSTRACT

A method for manufacturing an electrically conductive tip for field emission cathodes of vacuum electronic components includes forming the tip of doped silicon by molecular beam epitaxy of doped silicon through an opening of a mask and onto a substrate of monocrystalline silicon. The molecular beam epitaxy also produces a doped silicon layer on the surface of the mask.

10 Claims, 2 Drawing Sheets

METHOD FOR MANUFACTURING A MICRO-ELECTRONIC COMPONENT HAVING AN ELECTRICALLY CONDUCTIVE TIP OF DOPED SILICON

BACKGROUND OF THE INVENTION

1. Field of the Invention

The present invention relates generally to a method for manufacturing electrically-conductive tips which are used in components of vacuum micro-electronic devices.

2. Description of the Related Art

Electrically-conductive tips having small dimensions for use in vacuum micro-electronic components generally have a pyramid shape and are of a height of approximately 1 µm and a base area of approximately $1 \times 1$ µm$^2$. Such electrically-conductive tips are used as a tunnel tips and are generally manufactured of doped silicon.

A known technique for the manufacture of electrically-conductive tips utilizes micro-mechanics, as disclosed in, for example, the publication by Heuberger, MIKRO-MECHANIK, Springer Verlag, pp. 426–428. For instance, the electrically-conductive tips are manufactured by anisotropic etching which is dependent on crystal orientation. To that end, a silicon wafer having a corresponding crystal orientation is provided with an oxide mask that includes a matrix of circular silicon oxide spots. By under-etching in the anisotropic etching step, pyramids having cone angle of approximately 70° are formed under the silicon oxide spots.

The Heuberger publication also discloses a method in which a conductive tip of metal can be manufactured. A mask having circular openings is formed on a silicon substrate. Pyramidal metal islands form inside the openings as a result of vapor-deposition of molybdenum that is directed in the direction of the normal to the surface and perpendicular to the surface and as the result of rotation of the silicon substrate. Further mask steps or hybrid technologies are required using known methods to manufacture a complete component from the, thus, form conductive tip.

German patent 40 41 276 discloses an electrically-conductive tip of doped silicon which is manufactured by selective epitaxy. A mask is provided with an opening so that the surface of the substrate is uncovered. An electrically conductive tip is produced on the uncovered surface by selective epitaxy wherein the layer growth in the direction parallel to the surface of the substrate is less than in the direction perpendicular to the surface of the substrate. As soon as the height of the tip is no more than one half the clearance of the opening, a punctiform tip arises using this method. The height of the tip is dependent on the dimensions of the opening of the mask.

SUMMARY OF THE INVENTION

The present invention provides a method for manufacturing a micro-electronic component having an electrically conductive tip of doped silicon wherein the height of the tip is largely independent of the dimensions of the mask used. In particular, the method of the present invention is particularly suitable for the simultaneous self-aligned manufacturing of further electrodes for constructing a complete vacuum micro-electronic component.

These objectives are achieved by a method which includes producing a mask on a substrate of monocrystalline silicon, forming an opening in the mask so that the surface of the substrate is uncovered wherein the opening is such that the cross section of the surface of the substrate which is uncovered is larger than the cross section of the opening in the surface of the mask, and producing a tip of doped polysilicon on the uncovered surface of the substrate by molecular beam epitaxy using doped silicon which also deposits a doped silicon layer on the surface of the mask while leaving the opening intact (i.e., the opening is not closed by the epitaxial nucleation). The mask and the doped silicon layer thereon are not removed from the substrate, and are retained as part of the micro-electronic component.

Further developments of the present invention provide that a metal layer is deposited on the surface of the doped silicon layer and on the surface of the tip. Further advantages are provided when a first layer of a first insulator material is applied on to the substrate, a second layer of electrically conductive material is applied on to the first layer, and a third layer of a second insulator is applied on to the second layer to form the mask, the mask opening then being formed by anisotropic etching of the third and second layers and by isotropic etching of the first layer selectively relative to the second and third layers so that a portion of the surface of the substrate is uncovered and so that an under-etching of the first layer under the edges of the second layer results. Preferably, the first layer is formed of $SiO_2$, the second layer is of doped polysilicon, and the third layer is of $Si_3N_4$. In embodiments using a conductive layer applied over the mask and the tip, the conductive layer is preferably of a doped polysilicon or tungsten.

The monocrystalline substrate is preferably of (100) silicon and the quadratically shaped mask opening is preferrably oriented in either a (110), (101), or (011) direction.

The molecular beam epitaxy step is preferably implemented at a substrate temperature during the epitaxial process of between 400° C. and 700° C. with a vapor deposition rate of between 0.1 Å/sec and 5 Å/sec. The component thus manufactured is preferably utilized as a field emission cathode in vacuum electronics.

The present invention is based on the perception that a pyramid arises in a self organizing growth process during molecular beam epitaxy of silicon on a silicon surface that is surrounded by a mask. This is also referred to as local molecular beam epitaxy. The pyramid is caused to form as the result of the crystal striving to generate free surfaces having a minimum surface energy. The formation of (111) surfaces is favored over the formation of (110) or (100) surfaces. When the edge of a mask on a (100) substrate is oriented in a (110) direction, then (111) surfaces are formed with priority for this reason, and these (111) surfaces form the lateral surfaces of a pyramid. Since the length of pyramidal surfaces is limited by the surface diffusion of the atoms, it is advantageous to select mask openings which are comparable to the diffusion length.

Simultaneously with the creation of the pyramidal-shaped tip within the mask opening, the doped silicon layer is deposited on the surface of the mask during the molecular beam epitaxy step. The doped silicon layer that was results is either polycrystalline or amorphous and grows in a self-aligned mode. This doped silicon layer is suitable for use as an anode in a component wherein the tip is used as a field emission cathode. By selective deposition of a conductive layer onto the surface of the doped silicon layer and onto the tip, the conductivity of these structures may be further improved.

It is with the scope of the present to provide a mask formed of a layer sequence of insulating layers and at least one electrically conductive layer that is arranged between the insulating layers. The electrically conductive layer is used as a grid electrode for a field emission cathode tube.

To produce such a mask, a first layer of a first insulator, such as $SiO_2$, is applied onto the substrate. A second layer of an electrically conductive material is produced on the first insulator layer, and a third layer of a second insulator material, such $Si_3N_4$, is applied on to the layer of electrically conductive material. To form the mask opening, the third layer and the second layer are structured in an anisotropic etching process. Subsequently, the first layer is structured in an isotropic etching process so that it is etched selectively relative to the second layer and to the third layer to uncover the surface of the substrate and to under-etched the first layer under the edges of the second layer. The electrically conductive tip that is grown on the surface of the substrate using molecular beam epitaxy is insulated by the first layer from the second layer so that the second layer can be used as a grid. The second layer is insulated by the third layer from the doped silicon layer that is formed on the surface of the third layer.

It is advantageous to use a substrate of (100) silicon. A mask opening is then, preferably, to be quadratic and oriented in a (110) direction.

BRIEF DESCRIPTION OF THE DRAWINGS

The invention shall be set forth in greater detail below with reference to the drawings.

DETAILED DESCRIPTION OF THE PREFERRED EMBODIMENTS

Figure 1:
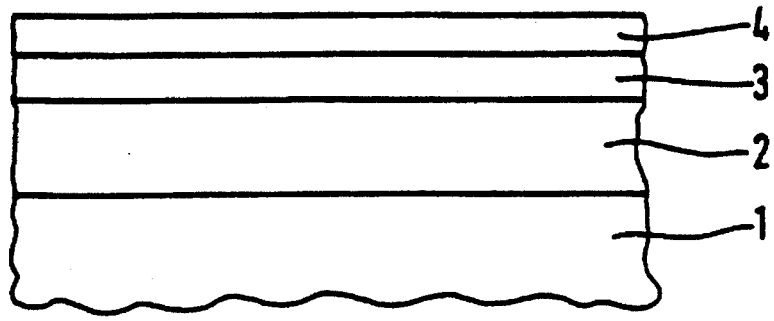
FIG. 1 is a cross section showing a substrate onto which have applied a first layer, a second layer and a third layer to serve as a mask.

Referring first to FIG. 1, a substrate 1 of, for example, (100) silicon is provided with a first layer 2 of $SiO_2$ on its top surface. The first layer 2 to is produced, for example, by CVD (chemical vapor deposition) to a thickness of, for example, 1 μm. A second layer 3 of an electrically conductive material is applied onto the first layer 2. The second layer 3 is of, for example, highly doped polysilicon having a thickness of 300 nm which is produced by CVD. A third layer for of $Si_3N_4$, for example, is applied onto the second layer 3. The third layer 4 is produced by CVD to a thickness of approximately 100 nm.

Figure 2:
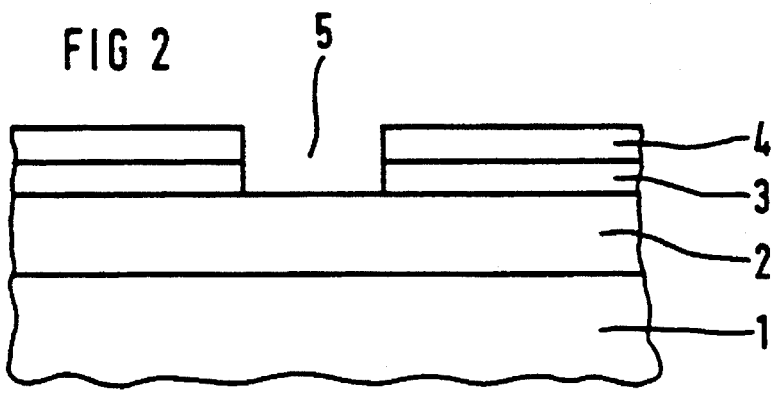
FIG. 2 is a cross section of the substrate of FIG. 1 showing the resulting opening in the second layer and the third layer after anisotropic etching.

In FIG. 2, the third layer 4 and the second layer 3 are structured during an anisotropic etching process by using a photoresist mask (not shown). The etching forms an opening 5 which has a quadratic cross section in the direction parallel to the surface of the substrate 1.

Figure 3:
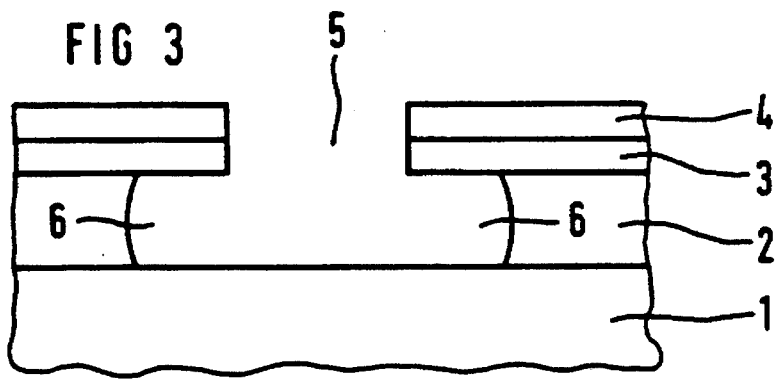
FIG. 3 is a cross section of the substrate of FIGS. 1 and 2 after isotropic etching of the first layer to produce the opening in the mask to the substrate.

Referring to FIG. 3, the first layer 2 is selectively etched relative to the second layer 3 and the third layer 4 in an isotropic etching process which etches the first layer 2 down to the surface of the substrate 1. The isotropic etching is carried out with, for example, buffered hydrofluoric acid (HF). By etching the opening 5 downward to the surface of the substrate, under-etchings 6 of the first layer 2 are formed under the edges of the second layer 3 so that the cross section of the opening 5 at the surface of the substrate 1 projects laterally beyond the cross section of the opening 5 in the region of the second layer 2 and third layer 4.

The opening 5 is quadratically shaped and is oriented in the (110) direction of the substrate 1 of (100) silicon. At the surface of the substrate 1, the quadratic opening has a length along each side of approximately 1–2 μm. The quadratic opening 5 has a length along each side of, for example, 300 nm in the region of the second layer 3 and the third layer 4.

Figure 4:
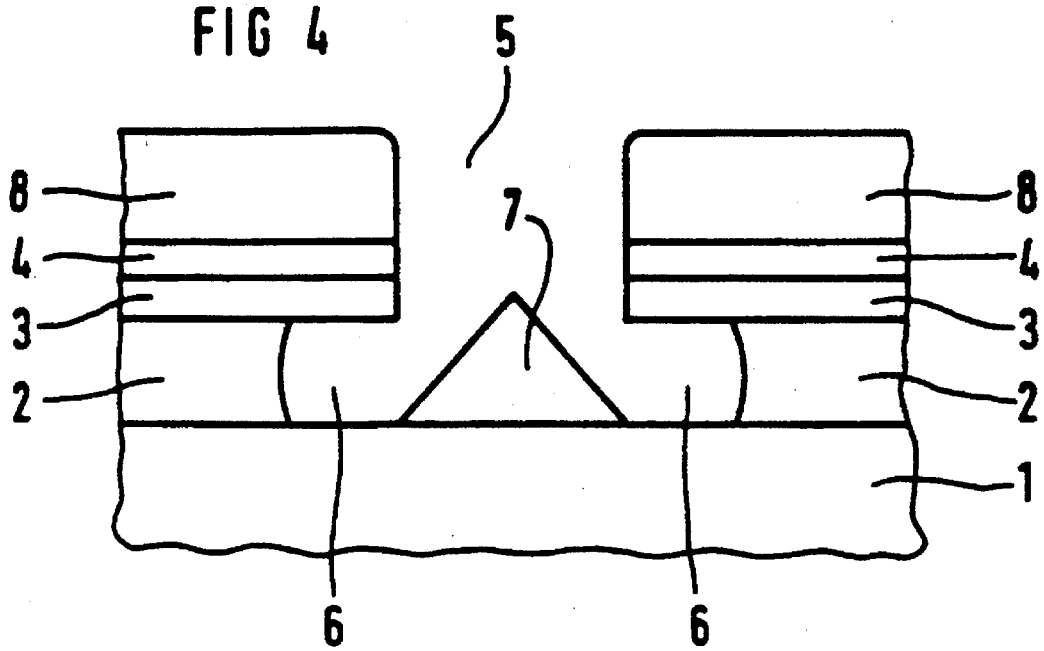
FIG. 4 is a cross section of the substrate after performing molecular beam epitaxy, including the pyramidal-shaped tip.

As can be seen in FIG. 4, a tip 7 is subsequently grown on the uncovered surface area of the substrate 1 by molecular beam epitaxy. The tip 7 is of doped silicon. During the molecular beam epitaxy step, a doped silicon layer 8 is simultaneously deposited on the surface of the third layer 4. The molecular beam epitaxy step is carried out at a substrate temperature during the epitaxial process of between approximately 400° C. and 700° C. and with a vapor deposition rate of between 0.1 Å/sec and 5 Å/sec. The tip 7 grows as a pyramid having lateral surfaces which are the (111) surfaces due to the physically conditioned, self-organizing growth process of the crystalline material. The tip 7 reaches a height of, for example, 400 nm. The doped silicon layer 8 deposited on the third layer 4 also reaches a thickness of, for example, 400 nm and is either amorphous or polycrystalline. The doped concentration of a preferred embodiment amounts to $10^{19} cm^{-3}$.

To improve the electrical conductivity of the doped silicon layer 8 of the tips 7, a conductive layer 9 is subsequently deposited in a self-aligned manner. For example, the conductive layer 9 is of tungsten which is deposited to a thickness of, for example, 100 nm. This conductive layer 9 is illustrated in FIG. 5.

Figure 5:
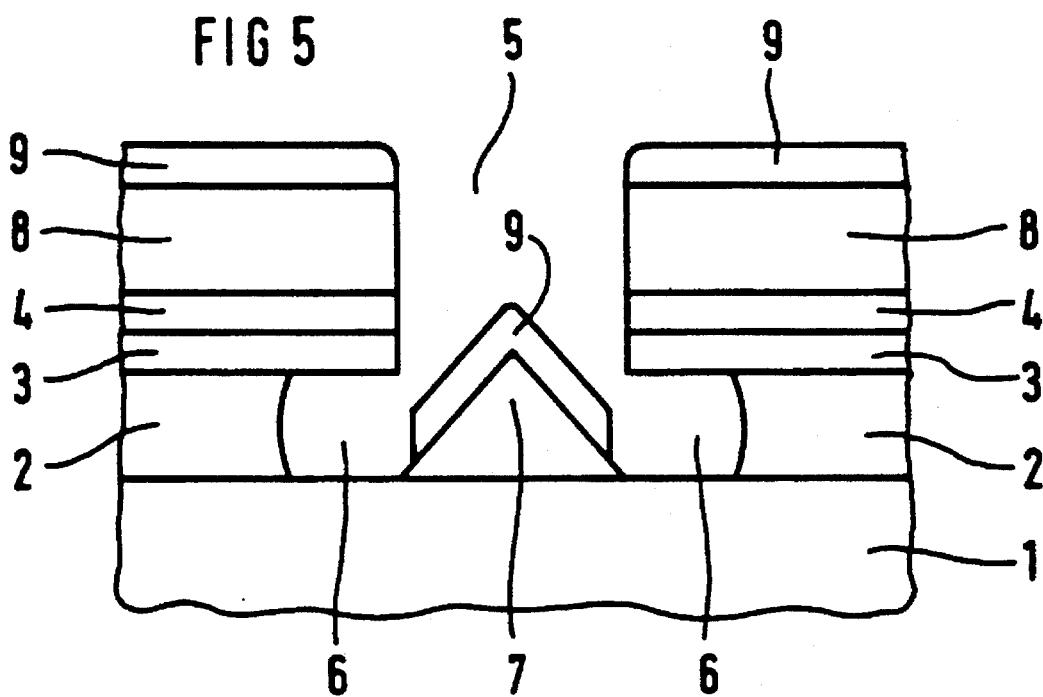
FIG. 5 is a cross section of the substrate shown after depositing of a conductive layer.

The embodiment of the semiconductor structure shown in FIG. 5 may be used as a field emission tube. The tip 7 has the conductive layer 9 thereover which serves as an emitter while the second layer 3 of electrically conductive material serves as the grid and the doped silicon layer 8 with the conductive layer 9 thereover serves as the anode of the device.

An advantage of the present invention is that only one mask step is required for manufacturing this structure. The grid levels in the component can be freely selected by variation of the layer thickness and layer sequences in the mask form of the first layer 2, the second layer 3 and third layer 4.

Thus, there is shown and described a manufacturing method for an electrically conductive tip of doped silicon wherein the tip of doped silicon as produced within an opening of a mask by molecular beam epitaxy of doped silicon on a substrate of monocrystalline silicon. A doped silicon layer is also produced on the surface of the mask. The resulting tip is suitable for use of a field emission cathode for components of vacuum electronics.

Although other modifications and changes may be suggested by those skilled in the art, it is the intention of the inventors to embody within the patent warranted hereon all changes and modifications as reasonably and properly come within the scope of their contribution to the art.

We claim:

1. Method for manufacturing a micro-electronic component having an electrically conductive tip of doped silicon, comprising the steps of: applying a mask on a substrate of monocrystalline silicon, wherein said step of applying said mask includes:

applying a first layer of a first insulator material onto said substrate;

applying a second layer of an electrically conductive material onto said first layer;

applying a third layer of a second insulator material onto said second layer;

providing an opening in said mask so that a portion of a surface of said substrate is uncovered at said opening, said opening having a smaller cross section than an uncovered surface portion of said substrate at said opening, wherein said step of providing said opening includes:

shaping said third layer by anisotropic etching to form said opening;

selectively shaping said first layer by isotropic etching relative to said second layer and said third layer to uncover said surface of substrate, said selective shaping resulting in under-etching of said first layer under edges of said second layer; and simultaneously producing a tip of doped polysilicon on said uncovered surface portion of said substrate and depositing a doped silicon layer on a surface of said mask by molecular beam epitaxy of doped silicon while maintaining said opening intact, and retaining said mask structure with said doped silicon layer thereon on said substrate.

2. A method as claimed in claim 1, further comprising the step of: depositing a conductive layer on a surface of said doped silicon layer and on a surface of said tip.

3. A method as claimed in claim 2, wherein said conductive layer comprises doped polysilicon.

4. A method as claimed in claim 2, wherein said conductive layer comprises tungsten.

5. A method as claimed in claim 1, wherein said first layer comprises $SiO_2$, said second layer comprises doped polysilicon, and said third layer comprises $Si_3N_4$.

6. A method as claimed in claim 1, wherein said substrate comprises (100)-silicon, and wherein said opening in said mask is quadratic.

7. A method as claimed in claim 6, wherein said opening is oriented in a (101) direction.

8. A method as claimed in claim 6, wherein said opening is oriented in a (110) direction.

9. A method as claimed in claim 6, wherein said opening is oriented in a (011) direction.

10. A method as claimed in claim 1, wherein said step of producing said tip by molecular beam epitaxy is conducted at a substrate temperature range of 400° C. to 700° C. and at a vapor-deposition rate of 0.1 Å/sec. to 5 Å/sec.

* * * * *